United States Patent
Seo

(10) Patent No.: US 12,308,062 B2
(45) Date of Patent: May 20, 2025

(54) ELECTRONIC DEVICE, METHOD FOR CONTROLLING STORING OPERATION, AND STORAGE MEDIUM

(71) Applicant: CASIO COMPUTER CO., LTD., Tokyo (JP)

(72) Inventor: Munetaka Seo, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 171 days.

(21) Appl. No.: 18/067,679

(22) Filed: Dec. 16, 2022

(65) Prior Publication Data
US 2023/0197131 A1      Jun. 22, 2023

(30) Foreign Application Priority Data

Dec. 22, 2021   (JP) ................. 2021-207805

(51) Int. Cl.
*G11C 11/00*         (2006.01)
(52) U.S. Cl.
CPC ................. *G11C 11/005* (2013.01)
(58) Field of Classification Search
None
See application file for complete search history.

(56) References Cited

U.S. PATENT DOCUMENTS

2004/0093551 A1    5/2004   Asano
2019/0332306 A1*  10/2019  Park .................. G11C 11/41

FOREIGN PATENT DOCUMENTS

| JP | 2004078453 A | 3/2004 |
| JP | 2004303382 A | 10/2004 |
| JP | 2011061374 A | 3/2011 |

* cited by examiner

*Primary Examiner* — Alfredo Bermudez Lozada
(74) *Attorney, Agent, or Firm* — Seed IP Law Group LLP

(57)    ABSTRACT

An electronic device includes: a magnetic first nonvolatile memory that has no movable element; a non-magnetic second nonvolatile memory; and a processor. The processor is configured to execute processing including: stopping writing data onto the first nonvolatile memory but writing the data onto the second nonvolatile memory in response to determining, based on magnetic field information regarding a magnetic field around the electronic device, that the electronic device is on a magnetic field equal to or stronger than a reference magnetic field strength in writing the data onto the first nonvolatile memory; and writing the data of the second nonvolatile memory onto the first nonvolatile memory in response to determining, based on the magnetic field information, that the electronic device is not on the magnetic field and that the data is on the second nonvolatile memory.

16 Claims, 2 Drawing Sheets

ELECTRONIC DEVICE, METHOD FOR CONTROLLING STORING OPERATION, AND STORAGE MEDIUM

CROSS-REFERENCE TO RELATED APPLICATIONS

This application is based upon and claims the benefit of priority from the prior Japanese Patent Application No. 2021-207805, filed on Dec. 22, 2021, the entire disclosure of which is incorporated herein by reference in its entirety.

TECHNICAL FIELD

The present disclosure relates to an electronic device, method for controlling storing operation, and a storage medium.

BACKGROUND ART

Faster data reading and writing with a larger capacity and lower cost is a challenge for digital processing in electronic devices, such as electronic computers. Various forms have been investigated and developed in addition to conventional volatile memories (random-access memory; RAM) and nonvolatile memories. Magnetic memories, such as a magnetic random access memory (MRAM), are known as one of storage methods that do not require refreshing; that can read and write data as fast as a RAM; and that require lower applied voltages with longer lives as compared with flash memories.

A magnetic memory controls and inverts the orientation of magnetization by using electric current to indicate values of "0" and "1". A magnetic memory is more vulnerable to strong magnetic fields than a conventional memory. To deal with this issue, JP2011-61374A discloses a technique to back up data of a magnetic memory into a different memory when a strong magnetic field is detected.

SUMMARY

According to an aspect of the present disclosure, there is provided an electronic device including: a magnetic first nonvolatile memory that has no movable element; a nonmagnetic second nonvolatile memory; and a processor, wherein the processor is configured to execute processing including: stopping writing data onto the first nonvolatile memory but writing the data onto the second nonvolatile memory in response to determining, based on magnetic field information regarding a magnetic field around the electronic device, that the electronic device is on a magnetic field equal to or stronger than a reference magnetic field strength in writing the data onto the first nonvolatile memory; and writing the data of the second nonvolatile memory onto the first nonvolatile memory in response to determining, based on the magnetic field information, that the electronic device is not on the magnetic field and that the data is on the second nonvolatile memory.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, an embodiment of the present disclosure is described with reference to the figures.

Figure 1:
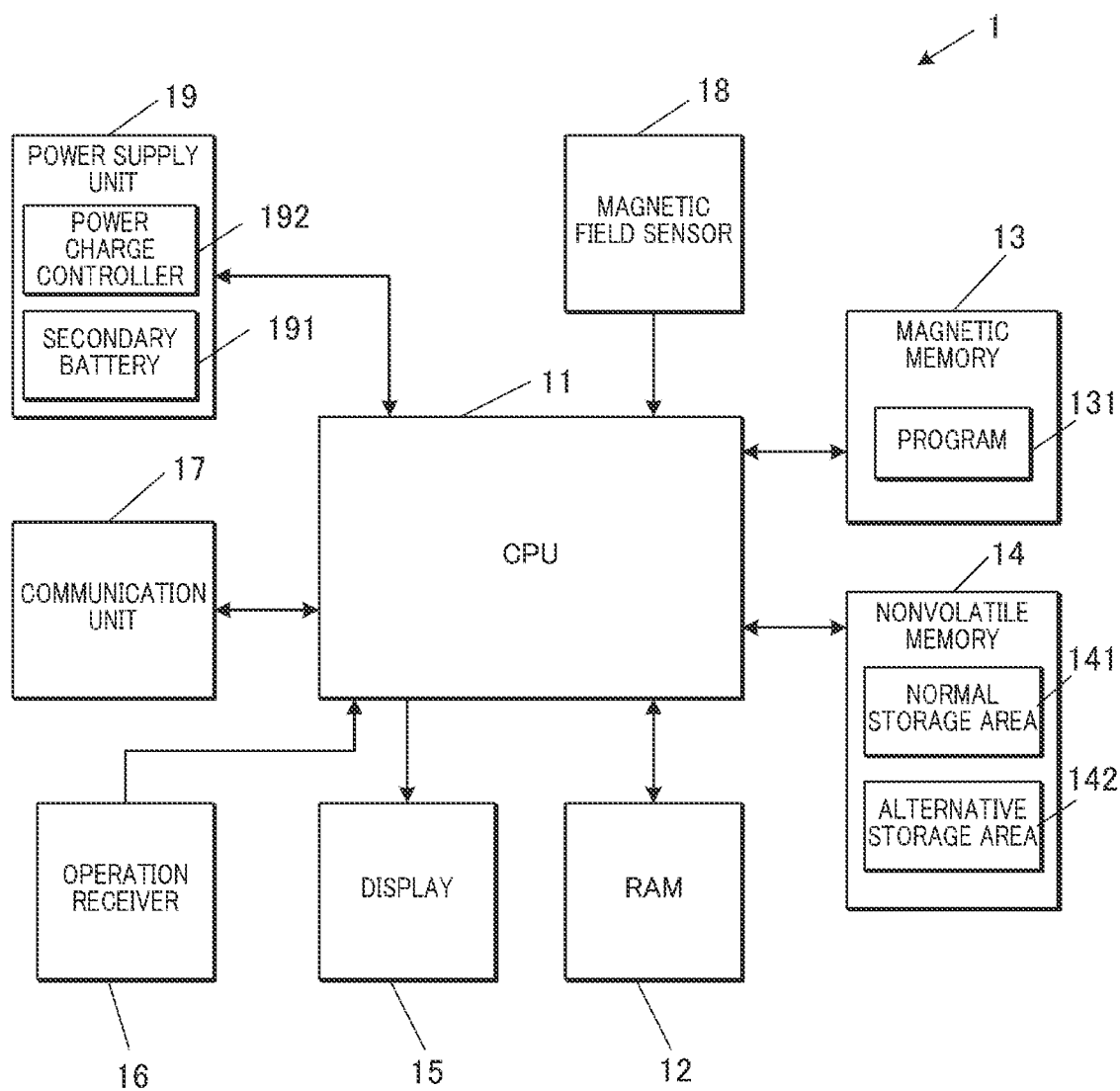
FIG. 1 is a block diagram showing functional components of an electronic device.

FIG. 1 is a block diagram showing functional components of an electronic device 1 in this embodiment.

The electronic device 1 is a small portable terminal device (computer), such as an electronic timepiece or a smartphone, for example. The electronic device 1 includes a central processing unit (CPU) 11 (controller), a RAM 12, a magnetic memory 13 (first nonvolatile memory), a nonvolatile memory 14 (second nonvolatile memory), a display 15, an operation receiver 16, a communication unit 17, a magnetic field sensor 18, and a power supply unit 19.

The CPU 11 is a hardware processor that performs arithmetic processing and centrally controls the operation of the electronic device 1. The CPU 11 may include multiple CPUs to perform parallel processing. In the parallel processing, the CPUs may perform the same processing content distributed to each CPU, or the CPUS may independently perform their respective different processes.

The RAM 12 provides the CPU 11 with a working memory space and stores temporary data. The RAM 12 may be a Dynamic Random Access Memory (DRAM), for example. Part of the RAM 12 or the entire RAM 12 may be a Static Random Access Memory (SRAM).

The magnetic memory 13 is a storage medium that has no movable element and that magnetically records data. For example, the magnetic memory 13 is a known Magnetoresistive Random Access Memory (MRAM, including one that uses a magnetic tunnel junction (MTJ)). The magnetic memory 13 is a nonvolatile memory. In the electronic device 1, the magnetic memory 13 is used for (i) retaining data, which is conventionally done by a nonvolatile memory, and (ii) accessing temporary data in processing, which is conventionally done by a volatile memory. The nonvolatile memory 14 records data non-magnetically. For example, the nonvolatile memory 14 is a flash memory (including a solid state drive (SSD)).

In general, the magnetic memory 13 reads and writes data faster than the typical nonvolatile memory 14 (e.g., flash memory). Especially, the magnetic memory 13 consumes less electric power in writing. The magnetic memory 13 stores data that is expected to be frequently updated. The nonvolatile memory 14 stores data including (i) a program 131 that is loaded and kept in the RAM 12 for a while once read out and (ii) initial setting data that is less likely to be referred to except at the time of initialization because modified setting is stored separately. Whether data is written on the magnetic memory 13 or the nonvolatile memory 14 may be determined on the basis of the content of the data to be stored and retained.

The nonvolatile memory 14 has a normal storage area 141 (first storage area) and an alternative storage area 142 (second storage area). The regions of these areas 141, 142 are separated (different regions are allocated to these areas 141, 142). The normal storage area 141 stores and retains data that is determined to be stored in the nonvolatile memory 14, as described above. The alternative storage area 142 temporarily stores data that is determined to be stored in the magnetic memory 13, as described below.

The display 15 includes a display screen on which various kinds of information are displayed under the control of the CPU 11. The display screen may be a liquid crystal display (LCD) or an organic electroluminescent (EL) display, for example, but is not specifically limited thereto. The display 15 may also have an LED lamp to output predetermined notifications by lighting or blinking, for example.

The operation receiver 16 receives operations input from the outside and outputs the received operations as input signals to the CPU 11. The operation receiver 16 includes part of or all of the following: a push button switch, a rotary switch, a slide switch, a rocker switch, and a touchscreen layered on the display screen, for example.

The communication unit 17 includes an antenna and a transmission-reception circuit. The communication unit 17 controls communications with external devices to transmit/receive data. The communication protocols that the communication unit 17 can handle are not limited to specific ones but may include Bluetooth (registered trademark), a wireless local area network (LAN), and infrared communication, for example. The communication unit 17 may be configured to perform communications according to multiple communication protocols simultaneously or selectively. The transmission-reception circuit performs processing including (i) modulation and demodulation of transmitted/received data and (ii) encoding and decoding of digital data.

The magnetic field sensor 18 measures a magnetic field and outputs the measurement result to the CPU 11. The magnetic field sensor 18 has a measuring range that can at least detect a reference magnetic field strength. The reference magnetic field strength is determined to be slightly lower than a magnetic field that may cause problems to the writing operation on the magnetic memory 13. The magnetic field sensor 18 may be configured to measure a magnetic field strength only, or may be configured to measure magnetic-field vector components in three axes that are orthogonal to each other. The three axes may be determined on the basis of the directions of a magnetic field applied to the magnetic memory 13. The magnetic field sensor 18 may be disposed near the magnetic memory 13 or may be disposed near a not-illustrated casing of the electronic device 1 so that the magnetic field sensor 18 can easily measure external magnetic fields.

The power supply unit 19 supplies electric power at a predetermined voltage to the components of the electronic device 1. Although the configuration of the power supply unit 19 is not specifically limited, the power supply unit 19 has a secondary battery 191, converts the electric power output by the secondary battery 191 at an appropriate voltage, and outputs the converted voltage. The secondary battery 191 may be chargeable with electric power supplied from outside. For example, a power charge controller 192 may control charging and discharging of the secondary battery 191 depending on (i) whether a power supply terminal is connected to an external terminal, (ii) whether a predetermined level of voltage is applied, and so forth.

Following is the description of how the electronic device 1 controls the storing operation of the magnetic memory 13 in this embodiment.

The MRAM, which is the magnetic memory 13 in this embodiment, writes data by inverting the magnetization of its ferromagnetic layer with current. The state of magnetization is affected when receiving an external strong magnetic field (when a strong magnetic field is present). In particular, when the MRAM receives an excessive magnetic field in writing data, the MRAM may be inappropriately magnetized and may write wrong data.

Figure 2:
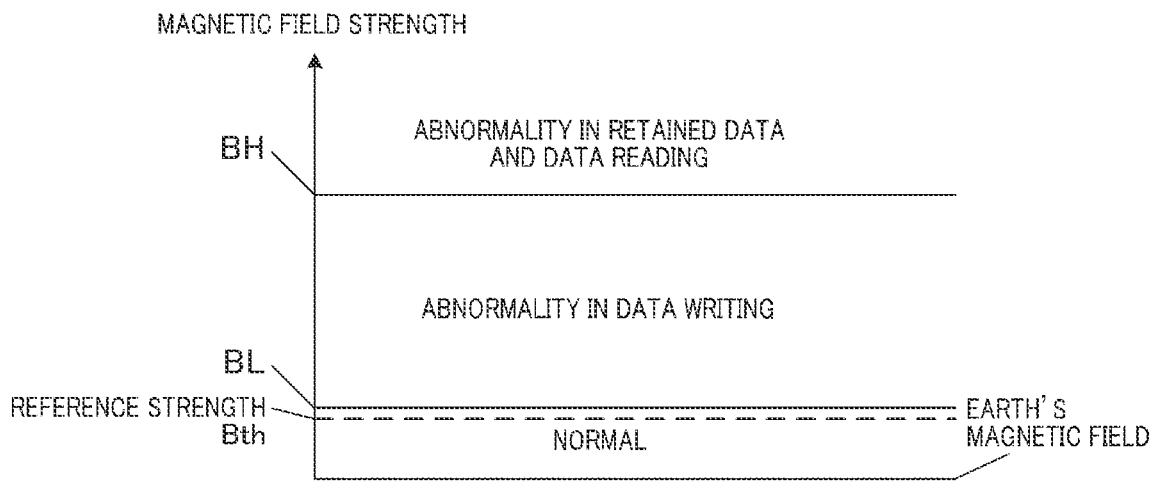
FIG. 2 is a figure to explain the effect of an external magnetic field on a magnetic memory.

FIG. 2 is a figure to explain the effect of an external magnetic field on the magnetic memory 13.

BL indicates the lower limit of a magnetic field strength that badly affects data writing on the magnetic memory 13. BH indicates the lower limit of a magnetic field strength that badly affects data reading and stored data itself. The lower limit BL is notably lower than the lower limit BH. The magnetic field strength that is equal to or greater than the lower limit BH is less likely to occur unless a strong magnet is intentionally brought closer. On the other hand, the magnetic field strength equal to or greater than the lower limit BL may be within a range that can frequently occur in using the portable electronic device. The lower limit BL depends on the magnetic memory 13. For example, the lower limit BL is the magnetic field of around 2000 A/m (magnetic flux density is approximately 2.6 mT, approximately 50 to 120 times greater than the Earth's magnetic field). The reference magnetic field strength Bth for judging risk to data writing may be lower than the lower limit BL. For example, the reference magnetic field strength Bth may be around 50% to 90% of the lower limit BL. That is, the reference magnetic field strength Bth is set to the level that does not cause problems (abnormalities) on data that has already been stored in the magnetic memory 13.

The electronic device 1 in this embodiment obtains (i) magnetic field information regarding a magnetic field that can affect data writing on the magnetic memory 13 and/or (ii) magnetic field information regarding states (operations) that can generate such a magnetic field (strong magnetic field). On the basis of the magnetic field information, the electronic device 1 stops writing data on the magnetic memory 13.

When data writing on the magnetic memory 13 is stopped for a while, the data to be stored in the magnetic memory 13 is temporarily stored and accumulated in the RAM 12. For example, obtaining a measurement result history continuously or intermittently takes up a large capacity of the RAM, which may eventually cause problems to the normal operation of the RAM 12. To deal with the issue, the electronic device 1 causes the alternative storage area 142 of the nonvolatile memory 14 to temporarily store data that is to be retained in the RAM 12 while stopping data writing on the magnetic memory 13. After data is again writable on the magnetic memory 13, the electronic device 1 reads the data in the alternative storage area 142 and writes the read data onto the magnetic memory 13.

Herein, magnetic fields to be considered may include (i) a magnetic field due to the approach to an external permanent magnet or a product, a factory, and so forth that generate a strong magnetic field and (ii) a magnetic field due to the operation of the electronic device 1 that generates a magnetic field, such as the communication operation and charging operation, for example. A combination of the above (i) and (ii) may occur when the charging connector of an external device has a magnet and the electronic device 1 is fastened to the charging connector in the charging operation, for example. In such a case, although the charging operation itself does not generate a strong magnetic field, the charging operation is equal to the approach to the magnet of the charging connector. Therefore, the charging operation may be considered as the approach to a strong magnetic field. Therefore, the information on the surrounding magnetic field (magnetic field information) to be obtained by the electronic device 1 may include (i) information on whether the communication operation is performed and (ii) information on whether the charging operation is performed, as well as information on the magnetic field directly measured by the magnetic field sensor 18. Therefore, the CPU 11 that obtains the operation state from the communication unit 17 and the power supply unit 19 constitutes an obtaining unit in this embodiment, as well as the magnetic field sensor 18.

The CPU 11 may obtain the magnetic field information on these operations not after starting these operations but immediately before starting these operations. In such a case, the CPU 11 may obtain the magnetic field information including advance notice information. Accordingly, the electronic device 1 can stably perform various processes including the data storing operation while surely restraining errors in writing data on the magnetic memory 13, the errors being caused by a strong magnetic field.

Figure 3:
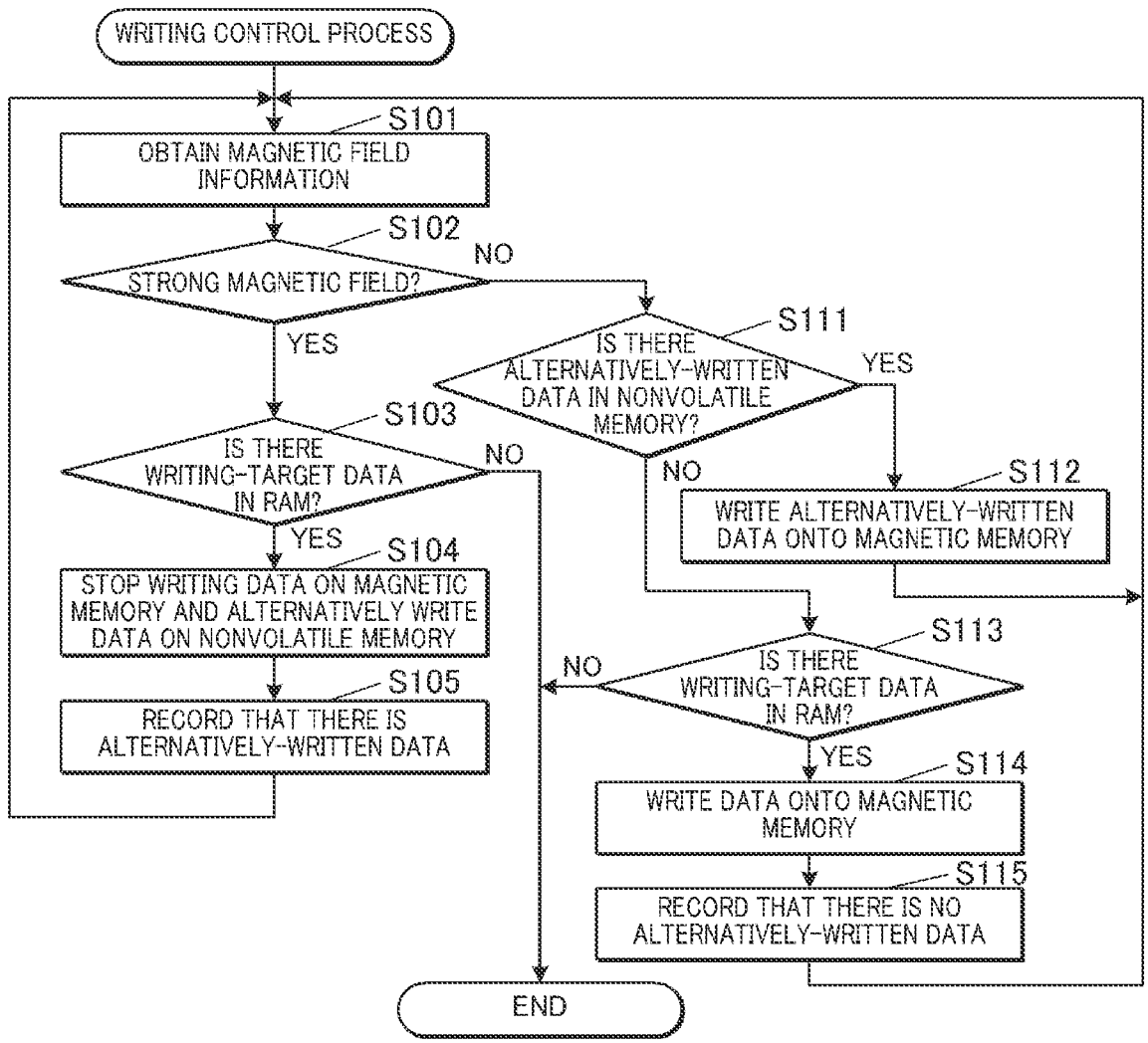
FIG. 3 is a flowchart of a writing control process.

FIG. 3 is a flowchart of a writing control process that includes the method for controlling the storing operation in this embodiment. The writing control process is controlled by the CPU 11. When data to be written on the magnetic memory 13 occurs, the program 131 is called and the writing control process is activated.

When the writing control process starts, the CPU 11 obtains magnetic field information, such as the measurement result by the magnetic field sensor 18 (Step S101). The CPU 11 determines whether the magnetic field is expected to have a reference strength level or greater (whether the electronic device 1, especially the magnetic memory 13, is receiving a strong magnetic field) (Step S102). As described above, the magnetic field during the communication operation or charging operation may not be measured directly. It may be determined beforehand that the electronic device 1 receives a strong magnetic field during the communication or charging operation, on the basis of experiments performed beforehand on the electronic device 1.

When determining that the electronic device 1 (the magnetic memory 13) is receiving a strong magnetic field (Step S102: YES), the CPU 11 determines whether the RAM 12 has writing-target data that is to be written on the magnetic memory 13 (Step S103). When determining that the RAM 12 does not have the writing-target data (Step S103: NO), the CPU 11 ends the writing control process.

When determining that the RAM 12 has the writing-target data (Step S103: YES), the CPU 11 stops the writing operation on the magnetic memory 13, and starts writing the writing-target data on the alternative storage area 142 in the nonvolatile memory 14 (Step S104: first control). If the magnetic field strength rapidly increases, the data lastly written on the magnetic memory 13 may have already affected by the strong magnetic field. Therefore, the CPU 11 may slightly go back to the data that has already been written on the magnetic memory 13 and write the data on the alternative storage area 142. The CPU 11 sets a record that the nonvolatile memory 14 has alternatively-written data that has been alternatively written on the nonvolatile memory 14 (Step S105). Herein, the CPU 11 also records and stores information indicating the address (place) in the magnetic memory 13 on which the alternatively-written data is to be written. The CPU 11 then returns to Step S101.

In Step S102, when determining that the electronic device 1 (magnetic memory 13) is not receiving a strong magnetic field (Step S102: NO), the CPU 11 determines whether there is a record that the nonvolatile memory 14 has alternatively-written data (Step S111). When determining that there is a record that the nonvolatile memory 14 has alternatively-written data (Step S111: YES), the CPU 11 reads the alternatively-written data in the alternative storage area 142 of the nonvolatile memory 14, and starts writing the alternatively-written data on a specific place of the magnetic memory 13, on the basis of the address stored in Step 105 (Step S112: second control). The CPU 11 then returns to Step S101.

When determining that there is not a record that the nonvolatile memory 14 has alternatively-written data (Step S111: NO), the CPU 11 determines whether the RAM 12 has writing-target data to be written on the magnetic memory 13 (Step S113). When determining that the RAM 12 does not have writing-target data (Step S113: NO), the CPU 11 ends the writing control process.

When determining that the RAM 12 has writing-target data (Step S113: YES), the CPU 11 writes the writing-target data on the magnetic memory 13 (Step S114). The CPU 11 sets a record that the nonvolatile memory 14 does not have alternatively-written data (Step S115). The CPU 11 then returns to Step S101.

As described above, according to this embodiment, the electronic device 1 includes the magnetic memory 13; the non-magnetic nonvolatile memory 14; and the CPU 11. When the CPU 11 determines, based on magnetic field information regarding a magnetic field around the electronic device 1, that the electronic device 1 is receiving a strong magnetic field equal to or stronger than a reference magnetic field strength in writing writing-target data onto the magnetic memory 13, the CPU 11 stops writing the writing-target data onto the magnetic memory 13 and writes the data onto the nonvolatile memory 14. When (i) the CPU 11 determines, based on the magnetic field information, that the electronic device 1 is not receiving the strong magnetic field and (ii) the data is on the nonvolatile memory 14, the CPU 11 writes the data of the nonvolatile memory 14 onto the magnetic memory 13.

According to the above configuration, when there is a magnetic field that affects data writing on the magnetic memory 13 and that is weaker than a magnetic field affecting data reading and data stored on the magnetic memory 13, the electronic device 1 temporarily and alternatively stores data on the nonvolatile memory 14. This allows the electronic device 1 to have an appropriate level of magnetic field shielding capability for the magnetic memory 13, thereby restraining an increase of production cost, size, and weight of the electronic device 1. Since the electronic device 1 is configured to stop the writing operation, the positional relation among the magnetic memory 13, the power supply unit 19, and the communication unit 17 in the electronic device 1 is less restricted. Accordingly, the electronic device 1 can be efficiently downsized and multi-functionalized.

As the magnetic field information, the CPU 11 may obtain at least (i) information indicating whether a charging operation of the electronic device 1 is performed or (ii) information indicating whether a communication operation is performed by the electronic device 1. When at least either the charging operation or the communication operation is performed, the CPU 11 may determine that the electronic device 1 is receiving the strong magnetic field. Assume that (i) an operation of the electronic device 1 involves approaching an external magnet and (ii) the positional relation between the electronic device 1 and the external magnet or the magnetic field strength is approximately fixed. In such a case, whether the electronic device 1 receives a problematic magnetic field can be determined on the basis of whether such an operation is performed. Therefore, the electronic device 1 can obtain information regarding a strong magnetic field without measuring a magnetic field. Further, in the above case, the electronic device 1 can obtain advance notice information before a strong magnetic field actually occurs (i.e., before the communication/charging operation starts). Therefore, the electronic device 1 can surely restrain occurrence of errors in writing data on the magnetic memory 13.

The electronic device 1 may include the magnetic field sensor 18 that obtains the magnetic field information. By actually measuring a magnetic field, the electronic device 1 can swiftly detect an unexpected strong magnetic field (e.g., an external magnetic field) and stop the writing operation on the magnetic memory 13.

When the CPU 11 writes the writing-target data, which is to be written on the magnetic memory 13, onto the nonvolatile memory 14, the CPU 11 may also store information regarding a place in the magnetic memory 13 on which the writing-target data is to be written. When (i) the CPU 11 determines that the electronic device 1 is not receiving the strong magnetic field and (ii) the data is written on the nonvolatile memory 14, the CPU 11 may write the data of the nonvolatile memory 14 onto the magnetic memory 13, based on the information regarding the place in the magnetic memory 13 on which the data is to be written. According to such a configuration, the electronic device 1 can arrange data in the magnetic memory 13 such that the data that has been directly written on the magnetic memory 13 and the data that has been written on the magnetic memory 13 via the nonvolatile memory 14 are in an appropriate writing order. Thus, the electronic device 1 can easily read the data in the magnetic memory 13 later.

The CPU 11 may determine which is used for retaining data, the magnetic memory 13 or the nonvolatile memory 14. The nonvolatile memory 14 may include the normal storage area 141 and the alternative storage area 142, the normal storage area 141 storing data that is determined to be retained in the nonvolatile memory 14, the alternative storage area 142 temporarily storing data that is determined to be retained in the magnetic memory 13. According to such a configuration, the nonvolatile memory 14 is not only a spare memory for the magnetic memory 13. The nonvolatile memory 14 and the magnetic memory 13 are appropriately used for storing and retaining data, depending on kinds of data. Thus, the electronic device 1 can efficiently store data and stably perform operations.

Further, according to the above embodiment, there is provided the method for controlling the storing operation on the magnetic memory 13 of the electronic device 1 that includes the magnetic memory 13 and the nonvolatile memory 14. In the method, when it is determined, based on magnetic field information regarding a magnetic field around the electronic device 1, that the electronic device 1 is receiving a strong magnetic field equal to or stronger than a reference magnetic field strength in writing data onto the magnetic memory 13, writing of the writing-target data onto the magnetic memory 13 is stopped and the writing-target data is written onto the nonvolatile memory 14 When (i) it is determined, based on the magnetic field information, that the electronic device 1 is not receiving the strong magnetic field and (ii) the data is written on the nonvolatile memory 14, the data of the nonvolatile memory 14 is written onto the magnetic memory 13.

According to such a method, writing of data on the magnetic memory 13 is selectively stopped depending on the magnetic field strength at the time of writing; the data is alternatively stored in the nonvolatile memory 14 as alternatively-stored data; and the alternatively-stored data is written on the magnetic memory 13 after the magnetic field strength sufficiently decreases. Thus, the method allows the electronic device 1 to appropriately retain data to be written on the magnetic memory 13 while stably operating without using too much capacity of the RAM 12.

Further, the program 131 of the above method for controlling the storing operation may be installed and executed as a software in the computer of the electronic device 1. Such a configuration easily allows the electronic device 1 including the magnetic memory 13 to operate stably without a special additional hardware component.

The above embodiment does not limit the present invention and can be variously modified. For example, according to the above configuration, the alternatively-written data on the nonvolatile memory 14 is left as it is after being written on the magnetic memory 13 (the alternatively-written data on the nonvolatile memory 14 is overwritten when other data is written on the nonvolatile memory 14). However, the alternatively-written data may be deleted from the nonvolatile memory 14 after being written on the magnetic memory 13.

According to the above embodiment, the normal storage area 141 and the alternative storage area 142 are completely separated in the nonvolatile memory 14. However, they may not be completely separated. When the normal storage area 141 and the alternative storage area 142 are not completely separated, the normal writing operation may be restricted so that the capacity of the area for storing alternatively-written data is approximately as large as the capacity of the magnetic memory 13.

According to the above embodiment, the magnetic field information includes the communication operation and the charging operation. However, the magnetic field information may not include either or both of these operations. The magnetic field information may include the communication operation regarding only one or more of the communication standards. If an operation of the electronic device 1 other than the communication and charging operations causes a strong magnetic field, the magnetic field information may include information on whether such an operation is performed.

When (i) the alternative storage area 142 has alternatively-written data and (ii) the RAM 12 has data to be stored in the magnetic memory 13, the electronic device 1 in the above embodiment firstly writes the alternatively-written data on the magnetic memory 13 after a strong magnetic field disappears. However, the present invention is not limited to this. The data in the RAM 12 may be firstly written on the magnetic memory 13 so that the data to be written on the magnetic memory 13 does not take up a large capacity in the RAM 12. If the RAM 12 intermittently receives data to be written on the magnetic memory 13, the CPU 11 may write alternatively-written data onto the magnetic memory 13 while writing data of the RAM 12 onto the magnetic memory 13.

The magnetic field sensor 18 may be used together with a normal geomagnetic sensor, as long as the magnetic field sensor 18 can retain a required measurement strength range.

Although the electronic device 1 is a portable device in the above embodiment, the electronic device 1 is not limited to this. The electronic device 1 may be a stationary device (including a device that is carried as desired).

In the above embodiment, the magnetic memory 13 is presented as an example of a computer-readable storage medium that stores the program 131 for controlling the data writing on the magnetic memory 13 of the present disclosure. However, the computer-readable storage medium is not limited to the magnetic memory 13. The program 131 may be stored in the nonvolatile memory 14 (e.g., a flash memory, such as an SSD). As other non-magnetic computer-readable storage media, other types of nonvolatile memory (e.g., ferroelectric random access memory (FeRAM)) or a portable storage medium (e.g., CD-ROM, DVD disc) can be used. Further, a carrier wave may be used as a medium to provide data of the programs of the present invention via a communication line.

The detailed configurations, contents and orders of processing operations, and so forth shown in the above embodiment can be appropriately modified without departing from the scope of the present invention.

Although an embodiment of the present disclosure has been described, the scope of the present invention is not limited to the embodiment described above but encompasses the scope of the invention recited in the claims and the equivalent thereof.

What is claimed is:

1. An electronic device comprising:
a magnetic first nonvolatile memory that has no movable element;
a non-magnetic second nonvolatile memory; and
a processor, wherein the processor is configured to execute processing including:
stopping writing data onto the first nonvolatile memory but writing the data onto the second nonvolatile memory in response to determining, based on magnetic field information regarding a magnetic field around the electronic device, that the electronic device is on a strong magnetic field equal to or stronger than a reference magnetic field strength in writing the data onto the first nonvolatile memory; and
writing the data of the second nonvolatile memory onto the first nonvolatile memory in response to determining, based on the magnetic field information, that the electronic device is not on the magnetic field and that the data is on the second nonvolatile memory,
wherein, as the magnetic field information, the processor obtains information on whether a charging operation of the electronic device is performed with a charging connector of an external device, the charging connector having a magnet, and in response to the charging operation being performed, the processor determines that the electronic device is on the strong magnetic field.

2. The electronic device according to claim 1, wherein
as the magnetic field information, the processor obtains information on whether a communication operation is performed by the electronic device, and
in response to the communication operation being performed, the processor determines that the electronic device is on the strong magnetic field.

3. The electronic device according to claim 2, wherein the processor obtains the magnetic field information including advance notice information immediately before starting the charging operation.

4. The electronic device according to claim 1, further comprising a magnetic field sensor that obtains the magnetic field information.

5. The electronic device according to claim 1, wherein
in writing the data onto the second nonvolatile memory, the processor also stores information regarding a place in the first nonvolatile memory on which the data is to be written, and
in response to determining that the electronic device is not on the strong magnetic field and that the data is on the second nonvolatile memory, the processor writes the data of the second nonvolatile memory onto the first nonvolatile memory, based on the information regarding the place in the first nonvolatile memory on which the data is to be written.

6. The electronic device according to claim 1, wherein
the processor determines which is used for retaining data, the first nonvolatile memory or the second nonvolatile memory, and
the second nonvolatile memory includes a first storage area and a second storage area, the first storage area storing data that is determined to be retained in the second nonvolatile memory, the second storage area temporarily storing data that is determined to be retained in the first nonvolatile memory.

7. A method for controlling storing operation of an electronic device that includes a magnetic first nonvolatile memory that has no movable element and a non-magnetic second nonvolatile memory, the method being for controlling the storing operation on the first nonvolatile memory, the method including:
stopping writing data onto the first nonvolatile memory but writing the data onto the second nonvolatile memory in response to determining, based on magnetic field information regarding a magnetic field around the electronic device, that the electronic device is on a strong magnetic field equal to or stronger than a reference magnetic field strength in writing the data onto the first nonvolatile memory; and
writing the data of the second nonvolatile memory onto the first nonvolatile memory in response to determining, based on the magnetic field information, that the electronic device is not on the strong magnetic field and that the data is on the second nonvolatile memory,
wherein, as the magnetic field information, information on whether a charging operation of the electronic device is performed with a charging connector of an external device, the charging connector having a magnet, and in response to the charging operation being performed, it is determined that the electronic device is on the strong magnetic field.

8. The method according to claim 6, wherein
as the magnetic field information, information on whether a communication operation is performed by the electronic device is obtained, wherein
in response to the communication operation being performed, it is determined that the electronic device is on the strong magnetic field.

9. The method according to claim 7, wherein obtaining the magnetic field information includes measuring by a magnetic field sensor.

10. The method according to claim 7, wherein
in writing the data onto the second nonvolatile memory, information regarding a place in the first nonvolatile memory on which the data is to be written is also stored, and
in response to determining that the electronic device is not on the strong magnetic field and that the data is on the second nonvolatile memory, the data of the second nonvolatile memory is written onto the first nonvolatile memory, based on the information regarding the place in the first nonvolatile memory on which the data is to be written.

11. The method according to claim 7, the method further includes:
determining which is used for retaining data, the first nonvolatile memory or the second nonvolatile memory, wherein the second nonvolatile memory includes a first storage area and a second storage area, the first storage area storing data that is determined to be retained in the second nonvolatile memory, the second storage area temporarily storing data that is determined to be retained in the first nonvolatile memory.

12. A non-transitory computer-readable storage medium storing a program for a computer of an electronic device that includes a magnetic first nonvolatile memory having no moving part and a non-magnetic second nonvolatile memory, the program causing the computer to perform a first control and a second control,
- wherein, in the first control, the computer stops writing data onto the first nonvolatile memory but writes the data onto the second nonvolatile memory in response to determining, based on magnetic field information regarding a magnetic field around the electronic device, that the electronic device is receiving a strong magnetic field equal to or stronger than a reference magnetic field strength in writing the data onto the first nonvolatile memory, and
- wherein, in the second control, the computer writes the data of the second nonvolatile memory onto the first nonvolatile memory in response to determining, based on the magnetic field information, that the electronic device is not on the strong magnetic field and that the data is on the second nonvolatile memory,
- wherein, as the magnetic field information, the computer obtains information on whether a charging operation of the electronic device is performed with a charging connector of an external device, the charging connector having a magnet, and in response to the charging operation being performed, the computer determines that the electronic device is on the strong magnetic field.

13. The storage medium according to claim 12, wherein the program further causes the computer to:
- obtain information on whether a communication operation is performed by the electronic device; and
- determine that the electronic device is receiving the strong magnetic field in response to the communication operation being performed.

14. The storage medium according to claim 12, wherein obtaining the magnetic field information includes measuring by a magnetic field sensor.

15. The storage medium according to claim 12, wherein
- in the first control, in writing the data onto the second nonvolatile memory, the computer also stores information regarding a place in the first nonvolatile memory on which the data is to be written, and
- in the second control, in response to determining that the electronic device is not on the strong magnetic field and that the data is on the second nonvolatile memory, the computer writes the data of the second nonvolatile memory onto the first nonvolatile memory, based on the information regarding the place in the first nonvolatile memory on which the data is to be written.

16. The storage medium according to claim 12, wherein the program causes the computer to determine which is used for retaining data, the first nonvolatile memory or the second nonvolatile memory, wherein
- the second nonvolatile memory includes a first storage area and a second storage area, the first storage area storing data that is determined to be retained in the second nonvolatile memory, the second storage area temporarily storing data that is determined to be retained in the first nonvolatile memory.

* * * * *